(12) United States Patent
Uchida

(10) Patent No.: US 11,133,082 B2
(45) Date of Patent: Sep. 28, 2021

(54) NON-VOLATILE SEMICONDUCTOR MEMORY DEVICE AND METHOD FOR DRIVING THE SAME

(71) Applicant: Kioxia Corporation, Minato-ku (JP)

(72) Inventor: Daisuke Uchida, Fujisawa (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/813,796

(22) Filed: Mar. 10, 2020

(65) Prior Publication Data

US 2021/0012854 A1 Jan. 14, 2021

(30) Foreign Application Priority Data

Jul. 10, 2019 (JP) .............................. JP2019-128108

(51) Int. Cl.
| | |
|---|---|
| *G11C 29/02* | (2006.01) |
| *G11C 29/44* | (2006.01) |
| *G06F 1/30* | (2006.01) |
| *G11C 29/12* | (2006.01) |
| *G06F 1/24* | (2006.01) |

(52) U.S. Cl.
CPC .............. *G11C 29/44* (2013.01); *G06F 1/24* (2013.01); *G06F 1/30* (2013.01); *G11C 29/021* (2013.01); *G11C 29/023* (2013.01); *G11C 29/025* (2013.01); *G11C 29/12015* (2013.01)

(58) Field of Classification Search
CPC ..... G11C 29/44; G11C 29/023; G11C 29/021; G11C 29/12015; G11C 29/025; G06F 1/30; G06F 1/24

See application file for complete search history.

(56) References Cited

U.S. PATENT DOCUMENTS

| | | | |
|---|---|---|---|
| 8,473,760 B2 | 6/2013 | Takeyama et al. | |
| 8,769,319 B2 | 7/2014 | Yang | |
| 9,268,489 B2 | 2/2016 | Aizman et al. | |
| 9,459,687 B2 | 10/2016 | Park et al. | |
| 9,684,468 B2 | 6/2017 | Fisher | |
| 2007/0126486 A1* | 6/2007 | Lee | H03K 3/012 327/218 |
| 2010/0205348 A1* | 8/2010 | Moshayedi | G11C 14/0018 711/102 |
| 2014/0139655 A1 | 5/2014 | Mimar | |
| 2018/0300181 A1 | 10/2018 | Hetzel et al. | |
| 2019/0102261 A1* | 4/2019 | Cesaretti | G06F 1/30 |
| 2019/0114093 A1* | 4/2019 | Roeder | G06F 3/0619 |

* cited by examiner

*Primary Examiner* — Khamdan N. Alrobaie
(74) *Attorney, Agent, or Firm* — Oblon, McClelland, Maier & Neustadt, L.L.P.

(57) ABSTRACT

The non-volatile semiconductor memory device comprises a non-volatile semiconductor memory, a controller for controlling the non-volatile semiconductor memory, the controller includes a reset terminal capable of receiving a reset signal from a host, an interface circuit capable of receiving a sleep command, and a data storing circuit, when the reset signal is received in a state which the interface circuit is being supplied with power, the data storing circuit is reset, when a sleep command is received in a state which the interface circuit is being supplied with power, the data necessary for communication with the host or the non-volatile semiconductor memory device is stored into the data storing circuit and power to the interface circuit is interrupted and when the reset signal is received in a state which power to the interface circuit is interrupted, the data is read from the data storing circuit.

14 Claims, 7 Drawing Sheets

NON-VOLATILE SEMICONDUCTOR MEMORY DEVICE AND METHOD FOR DRIVING THE SAME

CROSS-REFERENCE TO RELATED APPLICATION(S)

This application is based upon and claims the benefit of priority from the prior Japanese Patent Application No. 2019-128108, filed on Jul. 10, 2019, the entire contents of which are incorporated herein by reference.

FIELD

Embodiments described herein relate generally to a non-volatile semiconductor memory device and a method for driving the same.

BACKGROUND

A flash memory device is known a non-volatile semiconductor memory device. A flash memory device system is known as one of the systems for incorporating a flash memory device. For example, one of the flash memory device systems is UFS (Universal Flash Storage). In a flash memory device system, the power supply to the entire flash memory device may be turned off in order to reduce the power consumption at the time of driving. When the same power supplied to the flash memory device is also supplied to a device other than the flash memory device, in order to turn off only the power supply to the flash memory device, a power switch may be provided between the path of the power supply to the flash memory device and the flash memory device. In the flash memory device system, in order to avoid incorporating a power switch, a function to shut off the power to the flash memory device and not to resume the power supply other than for resetting the flash memory device may be implemented.

DETAILED DESCRIPTION

Figure 1:
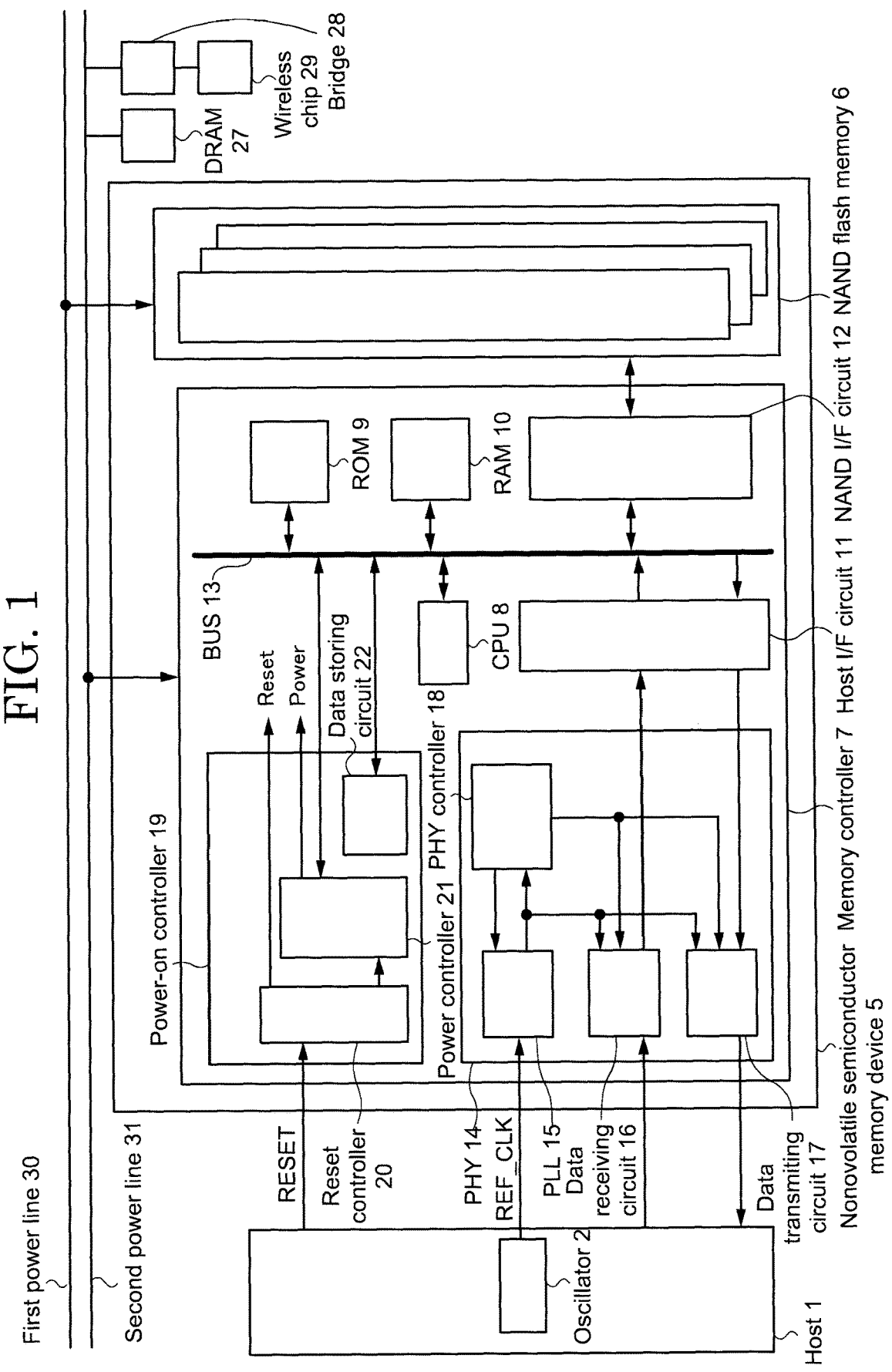
FIG. 1 is a block diagram of a system incorporating a non-volatile semiconductor memory device according to the present embodiment.

A non-volatile semiconductor memory device according to the present embodiment comprises a non-volatile semiconductor memory, a controller controlling the non-volatile semiconductor memory, including a reset terminal capable of receiving a reset signal from a host, an interface circuit capable of receiving a sleep command, and a data storing circuit, the controller resets the data storing circuit, upon reception of the reset signal in the state of being supplied with power to the interface circuit, the controller stores the data necessary for the communication with the host or the non-volatile semiconductor memory device and interrupting the power supply to the interface, upon a reception of the sleep command in the state of being supplied with power to the interface circuit and the controller reads the data from the data storing circuit, upon reception of the reset signal in the state of being supplied with power interrupted to the interface circuit.

The method for driving a non-volatile semiconductor memory device according to the present embodiment comprises, the non-volatile semiconductor memory device includes a non-volatile semiconductor memory, a controller controlling the non-volatile semiconductor memory, including a reset terminal capable of receiving a reset signal from a host, an interface circuit capable of receiving a sleep command and a data storing circuit, the method for driving the non-volatile semiconductor memory device comprises, the controller resetting the data storing circuit, upon a reception of the reset signal from the host in the state of being supplied with power to the interface circuit, the controller storing the data necessary for the communication with the host or the non-volatile semiconductor memory device into the data storing circuit and transiting into the state of being interrupted of power to the interface circuit, upon a reception of the sleep command from the host in the state of being supplied with power to the interface and the controller transiting into the state of reading the data from the data storing circuit, upon a reception of the reset signal from the host in the state of being interrupted of power to the interface circuit.

A system incorporating a non-volatile semiconductor memory device according to the present embodiment explained in detail below with reference to drawings. In the following description, components having substantially the same functions and configurations are denoted by the same reference numerals, and redundant descriptions will be made only when necessary. The following embodiments illustrate devices and methods which embody the technical ideas of the embodiments, and the technical ideas of the embodiments do not specify the materials, shapes, structure, arrangement, or the like of the components as follows. The technical idea of an embodiment may be modified in a variety of ways to within the scope of the patent.

<Overall Configuration of a System Mounted with Non-Volatile Semiconductor Memory Devices>

The overall configuration of the system incorporating the non-volatile semiconductor memory device according to the present embodiment will be described with reference to FIG. 1. In FIG. 1, connections between each block and a part of transmissions and receptions of signals or requests are indicated by an arrow lines. However, the connections between each block and the transmissions and receptions of the signals or the requests are not limited to these examples.

Although described later with references to FIGS. 1 to 4, the system incorporating the non-volatile semiconductor memory device 5 according to the present embodiment is a system that transmits and receives a sleep command (sleep request), power to some areas are interrupted and power to the remaining area is not interrupted, and that it is possible to retract and hold the necessary data for communication.

Further, it may also be a system for holding the stored data without being reset by the reset signal (RESET). The system incorporating the non-volatile semiconductor memory device 5 according to the present embodiment is a system receives a reset signal in a state where power is shield to a part of the area including the data receiving circuit 16 and the data transmitting circuit 17, reads the data required for communication from the remaining area, and recovers the power supply. In the system incorporating the non-volatile semiconductor memory device 5 according to the present embodiment, signals such as the sleep request and the reset signal are among the commands transmitted from the host 1 to the non-volatile semiconductor memory device 5. The system incorporating the non-volatile semiconductor memory device 5 according to the present embodiment includes some areas where power supply is interrupted and remaining areas where power supply is not interrupted, when the power is interrupted. The remaining areas includes a power-on controller 19. The system incorporating the non-volatile semiconductor memory device 5 according to the present embodiment is applied to, for example, a personal digital assistance such as a mobile phone, a smartphone, or a tablet device.

As shown in FIG. 1, the system incorporating the non-volatile semiconductor memory device 5 includes a host 1 and a non-volatile semiconductor memory device 5. The host 1 has an oscillator 2. The non-volatile semiconductor memory device 5 includes a NAND flash memory 6 and a memory controller 7.

The host 1 includes hardware and software for accessing the non-volatile semiconductor memory device 5. The host 1 is connected to the non-volatile semiconductor memory device 5 to manage the internal physical state of the non-volatile semiconductor memory device 5. Although the internal physical state is the internal state of the non-volatile semiconductor memory device 5, such as the power-on state, the active state and the sleep state, these states will be described in detail later.

The oscillator 2 is connected to a PLL 15. The oscillator 2 generates a reference clock (REF_CLK) for driving the non-volatile semiconductor memory device 5 and supplies the generated reference clock to the PLL 15. The system incorporating the non-volatile semiconductor memory device 5 according to the present embodiment can set one of a plurality of frequencies as a frequency of the reference clock, for example. The frequency of the reference clock is, for example, 19.2 MHz, 52 MHz, and so on.

The non-volatile semiconductor memory device 5 receives, for example, the reference clock from the host 1, the reset signal, a write and read request for data to the non-volatile semiconductor memory device 5, and a transition request for the internal state of the non-volatile semiconductor memory device 5. The non-volatile semiconductor memory device 5 performs processing in response to a request from the host 1.

A NAND flash memory 6 is connected to a NAND flash memory interface circuit 12 (hereinafter referred to as NAND flash memory I/F circuit). The NAND flash memory 6 stores a set value relating to the frequency of the reference clock for driving the NAND Flash Memory 6, a control program from the NAND Flash Memory 6 to the RAM 10 required when the power supply is recovered, and the table data and the like required for operating the NAND Flash Memory 6. The NAND flash memory 6 is also referred to as a non-volatile semiconductor memory in this specification and the like. For example, the setting value related to the frequency of the reference clock for driving the NAND Flash Memory 6 is the frequency setting value of the reference clock.

The memory controller 7 includes a CPU 8, ROM 9, RAM 10, a host interface circuit (hereafter referred to as a host I/F circuit) 11, the NAND flash memory I/F circuit 12, and a BUS 13, a PHY 14, and a power-on controller 19. The memory controller 7 is connected with the host 1 and controls the NAND flash memory 6.

The CPU 8 controls the driving of the non-volatile semiconductor memory device 5. For example, the CPU 8 reads out the control programs which are stored in the NAND flash memory 6 or the ROM 9, and loads (recovers) a predetermined for developing them on the RAM 10. In the present specification, the control program may be referred to as, for example, FW. The CPU 8 sets the blocks which can be operable in accordance with control programs.

The ROM 9 is a control program used by the CPU 8, a part of the control program, or memories for storing data and the like. The RAM 10 is a control program used by the CPU 8, or a memory for storing data or the like. The host I/F circuit 11 performs interface processing for performing communication between the host 1 and the memory controller 7. The flash memory I/F circuit 12 performs an interface process for performing communication between the memory controller 7 and the NAND flash memory 6. In the present specification, the flash memory I/F circuit 12 is also referred to as the non-volatile semiconductor memory interface circuit. The BUS 13 interconnects the CPU 8, the ROM 9, the RAM 10, the host I/F circuit 11, and the NAND flash memory I/F circuit 12.

The PHY 14 includes a PLL 15, a data receiving circuit 16, a data transmitting circuit 17, and a PHY controller 18. The PLL 15 receives the reference clock from the oscillator 2 and stores the frequency setting value of the reference clock. The PLL 15 generates a high-frequency clock with high precision based on the reference clock frequency set in accordance with the set reference clock. In addition, the PLL 15 supplies the high-frequency clock to the data receiving circuit 16, the data transmitting circuit 17, and the PHY controller 18. The data receiving circuit 16, the data transmitting circuit 17, and the PHY controller 18 receive the high-frequency clock. Therefore, the data receiving circuit 16, the data transmitting circuit 17, and the PHY controller 18 can operate at high-speed. The data receiving circuit 16 receives data from the host 1 and the received data is transmitted to the host I/F circuit 11. The data transmitting circuit 17 receives data from the host I/F circuit 11 and the received data is transmitted to the host 1. The PHY controller 18 controls the operation of the PLL 15, the data receiving circuit 16, and the data transmitting circuit 17. As described above, the PHY 14 is physically connected with the host 1 and communicates with the host 1. In this specification, the PHY 14 is also referred to as, for example, a transmitting and receiving circuit. In addition, the PHY 14 may also be called a sending and receiving circuit. In addition, the PHY 14 and the Host Interface Circuit 11 may be collectively called an interface circuit.

The power-on controller 19 includes a reset controller 20, a power controller 21, and a data storing circuit 22. The power-on controller 19 is an area in which the power is not interrupted even when the sleep request of the non-volatile semiconductor memory device 5 is received, and is not reset even when the reset signal is received. Here, reset means initialization.

The reset controller 20 has the reset terminal capable of receiving the reset signal. Based on the reset signal from the host 1, the reset controller 20 controls all resets of the memory controller 7 in the case of the power-on and active state, and controls resets other than the power-on controller 19 in the case of the sleep state. For example, the reset controller 20 may reset the data storing circuit 22 upon receiving the reset signal while being power is being supplied to the interface circuit. In addition, the reset controller 20 generates a power recovery request (Power on request) from depending on assertion or deassertion state requested by the received reset signal to change each block from the sleep state to the power on state and notifies the power controller 21.

The power controller 21 controls the power supply to each block included in the memory controller 7. The power controller 21 performs the power supply to each block, and when receiving the power off request from the CPU 8, interrupts the power supply to each block. The power controller 21, when receiving the power recovery request from the reset controller 20, recovers the power supply to each block.

The data storing circuit 22 is a volatile memory circuit having a volatile memory element for storing internal information of each block included in the memory controller 7. The volatile memory element is, for example, a memory element such as a SRAM, a flip-flop, or the like. The data storing circuit 22 receives internal information of each block read the CPU 8 from each block based on the sleep requests and stores internal information of each block. For example, when the non-volatile semiconductor memory device 5 according to the present embodiment receives a sleep command while the power is supplied to the interface circuit, the internal information with the host 1 or the NAND Flash Memory 6 is stored in the data storing circuit 22, and the non-volatile semiconductor memory device 5 interrupts the power supply to the interface circuit. On the basis of the reset signal, when the data storing circuit 22 receives a signal for reading data from the CPU 8 which has a recovered power supply, the data storing circuit 22 sends the internal data stored in each block to the CPU 8. For example, when the non-volatile semiconductor memory device 5 according to the present embodiment receives a reset signal while the power supply to the interface circuit is interrupted, the non-volatile semiconductor memory device 5 reads the internal information from the data storing circuit 22.

The system incorporating the non-volatile semiconductor memory device 5 according to the present embodiment includes a first power supply line 30 which is supplied with a first power supply, and a second power supply line 31 which is supplied with a second power supply. The non-volatile semiconductor memory device 5 is connected to the second power supply line 31. Devices other than the non-volatile semiconductor memory device 5, for example, a LSI, a bridge 28 and the like may also be connected to the second power supply line 31. The NAND flash memory 6 is connected to the first power supply line 30 which is supplied with a first power supply. The LSI is, for example, a DRAM 27, or a wireless chip 29 connected via the bridge 28. The system incorporating the non-volatile semiconductor memory device 5 according to the present embodiment does not have a power switch between the second power supply line 31 and the non-volatile semiconductor memory device 5.

In the system incorporating the non-volatile semiconductor memory device 5 according to the present embodiment, the internal information of each block included in the memory controller 7 is data necessary for communication. The data necessary for communication may be data for securing communication or data for recovering communication. The internal information is necessary, for example, to recover communication between the host 1 and the non-volatile semiconductor memory device 5. In the present embodiment, an example is shown in which the internal information is a frequency setting value of the reference clock. Furthermore, the internal information such as the frequency setting value of the reference clock and the frequency of the reference clock, for example, are stored in each block such as the data storing circuit 22 and the PHY 14 as binary digital data.

<Transition of the Internal State of the Non-Volatile Semiconductor Memory Device>

An example of the transition of the internal state of the non-volatile semiconductor memory device 5 according to the present embodiment will be described with reference to an example of a state transition diagram of FIG. 2. Descriptions of the same or similar configurations as in FIG. 1 may be omitted.

Figure 2:
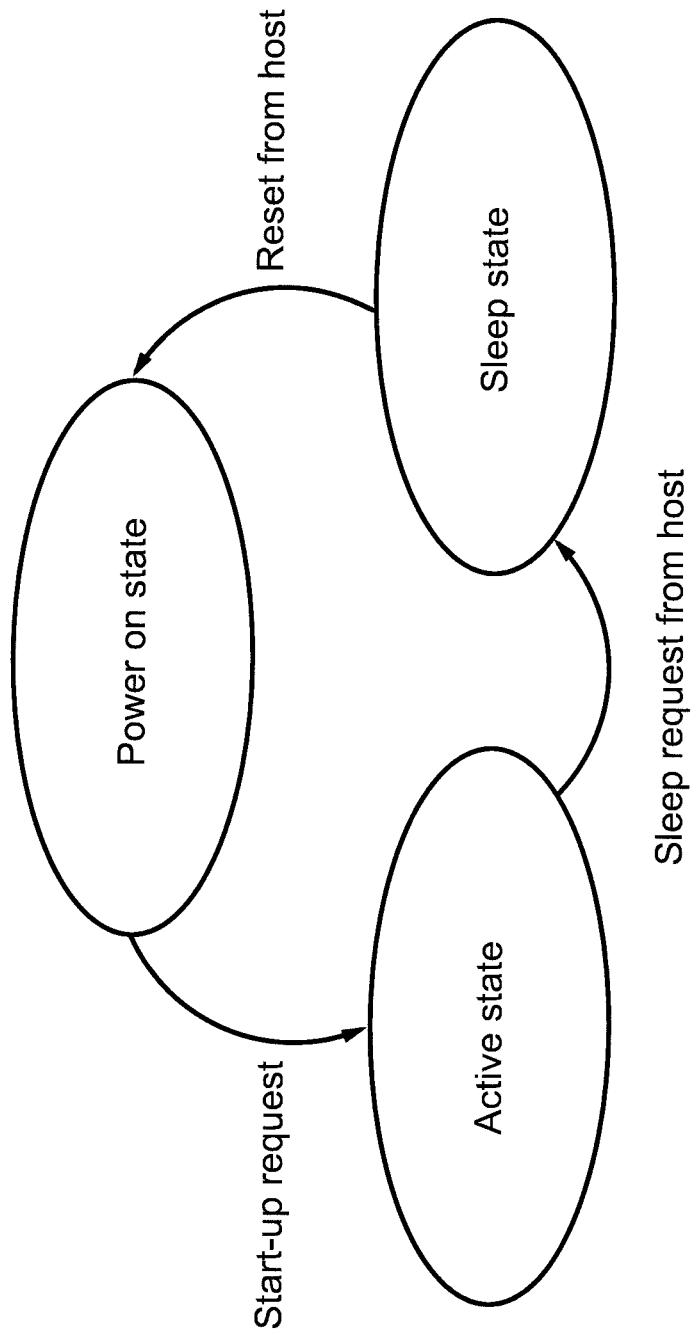
FIG. 2 is an example of a state transition diagram of a non-volatile semiconductor memory device according to the present embodiment.

As illustrated in FIG. 2, for example, the non-volatile semiconductor memory device 5 transitions from the powered-on state to the active state by receiving a start-up request from the host 1. In the active state, the non-volatile semiconductor memory device 5 can be driven. In addition, the non-volatile semiconductor memory device 5 transitions from the active state to the sleep state when a sleep request is received from the host 1. In the non-volatile semiconductor memory device 5 in the sleep state, the power supply to the some areas are interrupted, and the power supply to the remaining areas are not interrupted. At this time, the internal information, which is data required for communication between the host 1 or the NAND flash memory 6, is stored in the remaining areas. In addition, when the reset signal is received from the host 1, the non-volatile semiconductor memory device 5 transition from a sleep state to power-on state. In this case, the power supply is recovered to some areas, and the internal information is read from the remaining areas to some areas. In this specification or the like, "recovering the power supply" may be referred to as "restarting the power supply".

<The Driving Method of the System Incorporating the Non-Volatile Semiconductor Memory Device>

An example of a drive method of the system incorporating the non-volatile semiconductor memory device 5 according to the present embodiment will be described with reference to the diagrams showing the drive sequences of FIGS. 3 and 4. Descriptions of configurations identical to or similar to FIGS. 1 and 2 may be omitted.

Figure 3:
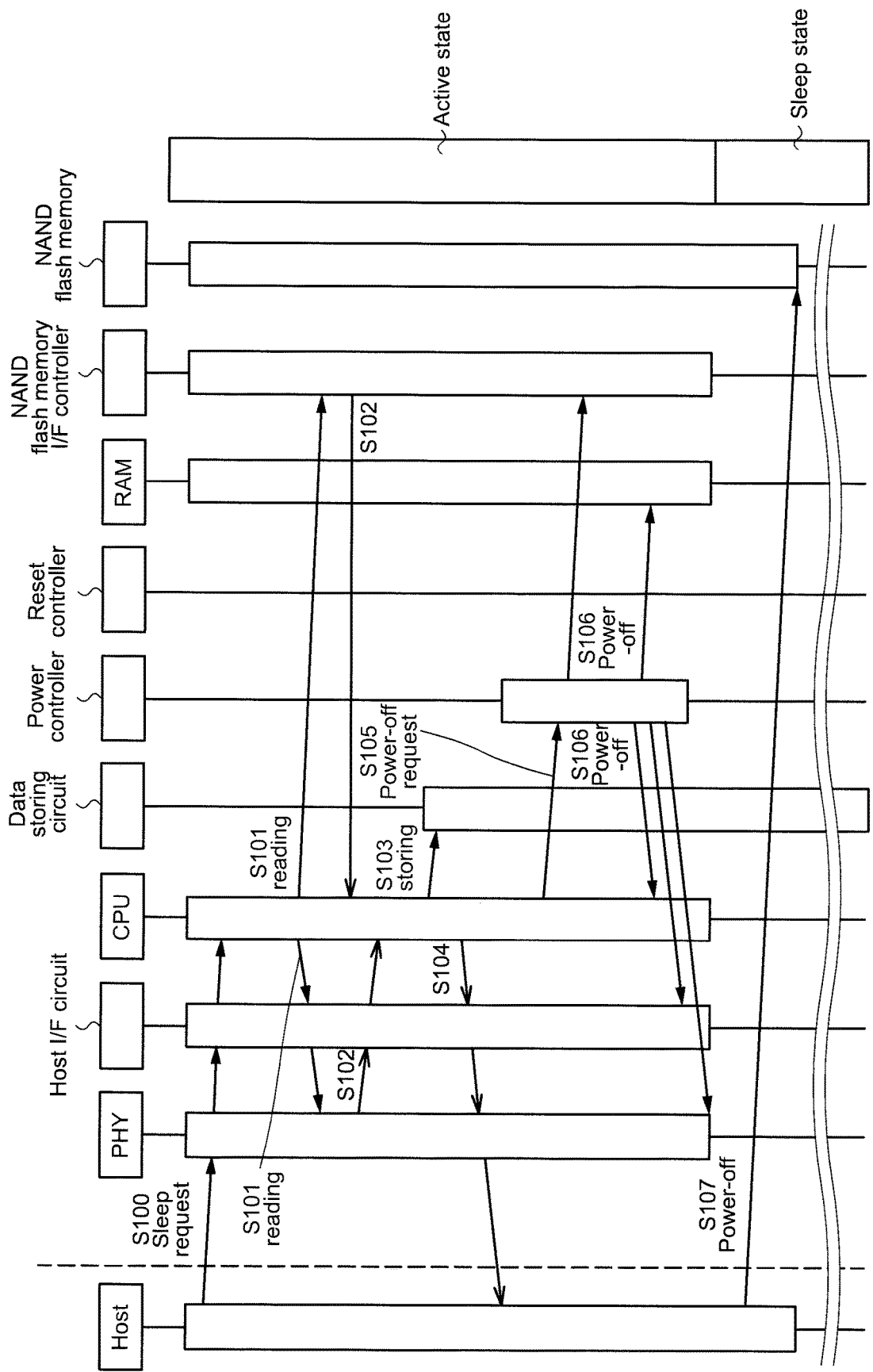
FIG. 3 is a diagram illustrating a driving sequence of a system incorporating a non-volatile semiconductor memory device according to the present embodiment.

FIG. 3 is a diagram illustrating a drive sequence in which the non-volatile semiconductor memory device 5 transitions from the active state to the sleep state in a system incorporating the non-volatile semiconductor memory device 5 according to the present embodiment.

As shown in FIG. 3, the host 1 sends a sleep request to the PHY 14 (step S100). Here, the NAND Flash Memory I/F circuit 12, the CPU 8, the ROM 9, the RAM 10, the Host Interface Circuit 11, and the PHY14 are supplied with a second power from the second power supply line 31, while the NAND Flash Memory 6 is supplied with a first power from the first power supply line 30. When the CPU 8 receives a sleep request via the PHY14 and the host I/F circuit 11, the signal for reading data is sent to the PHY 14 and the NAND flash memory I/F circuit 12 via the host I/F circuit 11 (step S101). When the host I/F circuit 11, the PHY 14, and the NAND flash memory I/F circuit 12 receive a signal for reading data, the internal information stored in the host I/F circuit 11, the PHY 14, and the NAND flash memory I/F circuit 12 is sent to the CPU 8 (step S102).

When the CPU 8 receiving the internal information, the CPU 8 transmits the internal information and a signal instructing to store the internal information to the data storing circuit 22, and the data storing circuit 22 which has stored the internal information (step S103).

The CPU 8 transmits that it has instructed to store the internal information to the host 1 via the Host Interface Circuit 11 and the PHY 14, and the CPU 8 transmits that it is ready for power interruption of the power supply for the first power supply line 30 while maintaining the power supply to the second power supply line to the host 1 via the Host Interface Circuit 11 and the PHY14 (step S104). Following this, the CPU 8 transmits a power-off request to the power controller 21 (step S105).

When the power controller 21 receives the power-off request, and interrupts the second power supply from the second power supply line 31 to the NAND flash memory I/F circuit 12, CPU 8, RAM 10, host I/F circuit 11, and the PHY 14 (step S106). Furthermore, although not shown in the diagram, the power controller 21 receives the power-off request, and interrupts the power supply from the second power supply line 31 to the ROM 9 and power devices other than the non-volatile semiconductor memory device 5. Next, the host 1 interrupts the first power supply from the first power supply line 30 to the NAND flash memory 6 (step S107). As described above, the non-volatile semiconductor memory device 5 transitions from the active state to the sleep state.

Figure 4:
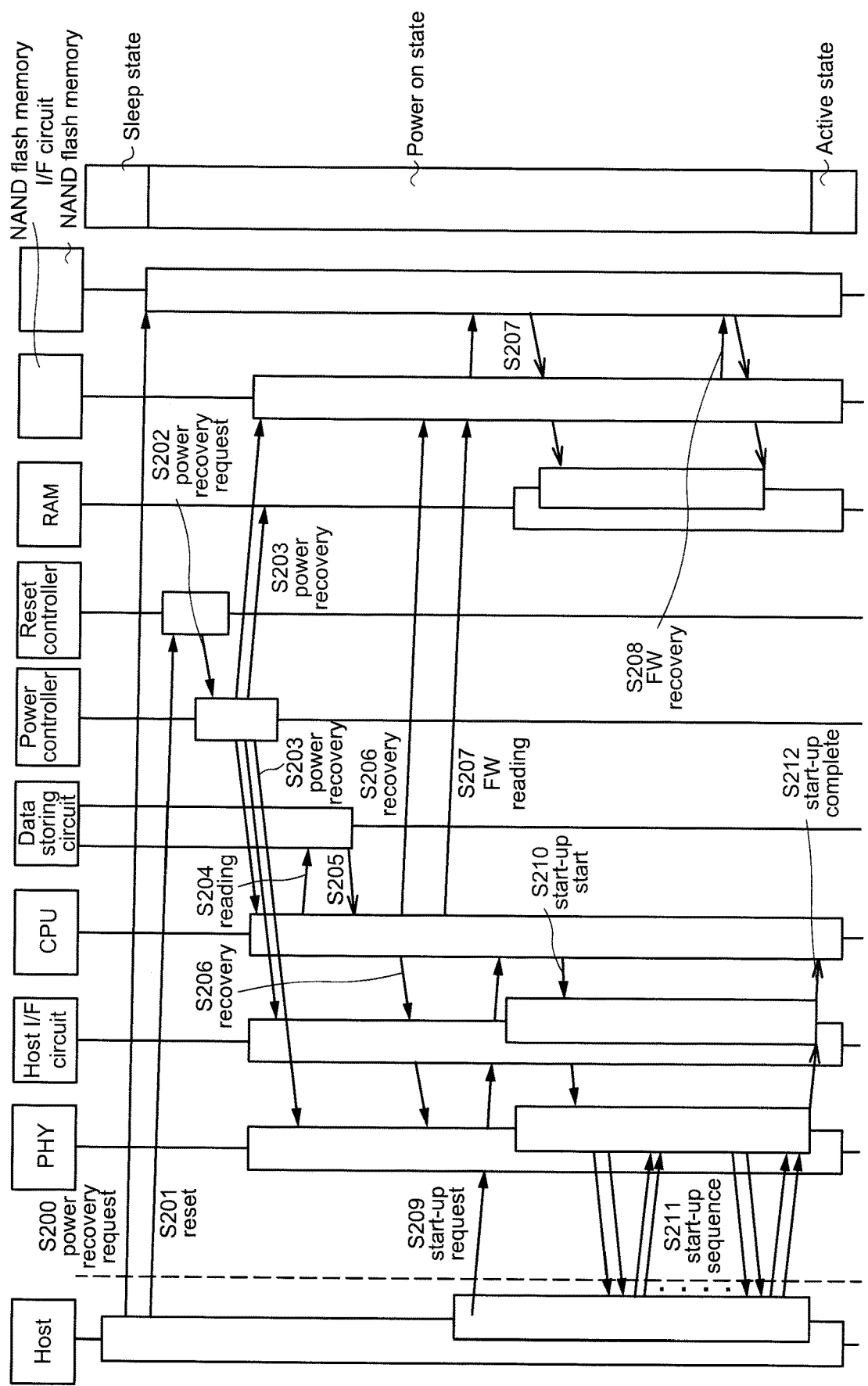
FIG. 4 is a diagram illustrating a driving sequence of a system incorporating a non-volatile semiconductor memory device according to the present embodiment.

FIG. 4 is a diagram illustrating a driving sequence in which the non-volatile semiconductor memory device 5 transitions from the sleep state to the power-on state and then transitions to the active state in the system incorporating the non-volatile semiconductor memory device 5 according to the present embodiment. As shown in FIG. 4, the host 1 recovers the first power supply from the first power supply line 30 to the NAND flash memory 6 (step S200). In addition, the Host 1 also asserts or deasserts a reset signal to the non-volatile semiconductor memory device 5. The reset signal is transmitted to the reset controller 20 (step S201). The non-volatile semiconductor memory device 5 transitions from a sleep state to a power-on state.

When the reset controller 20 receives a reset signal from the host 1, the reset controller 20 generates a power recovery request from the assertion or deassertion state of the received reset signal to make the blocks go from the sleep state to the power-on state, and notifies the power recovery request to the power controller 21 (step S202). When the power controller 21 receives the power recovery request, the power controller 21 recovers the second power supply from the second power supply line 31 to the NAND flash memory I/F circuit 12, the CPU 8, the RAM 10, and the host I/F circuit 11, and the PHY 14 (step S203). Furthermore, although not shown in the diagram, the power controller 21 recovers the second power supply from the second power supply line 31 to the ROM 9 and devices other than the non-volatile semiconductor memory device 5 when receiving the power recovery request.

When the power supply is recovered, the CPU 8 transmits the signal for reading data to the data storing circuit 22 (step S204). When the data storing circuit 22 receives the signal for reading data, the data storing circuit 22 transmits the internal information stored in the data storing circuit 22 to the CPU 8 (step S205).

When the CPU 8 receives the internal information stored in the data storing circuit 22, the CPU 8 makes the PHY 14 and the NAND flash memory I/F circuit 12 operable through the host I/F circuit 11 and the host I/F circuit 11 (step S206).

Next, the CPU 8 transmits a FW read instruction signal to the NAND flash memory I/F circuit 12. The NAND flash memory I/F circuit 12 receives the FW read instruction signal, the FW which is stored within the NAND flash memory 6 is read out from the NAND flash memory 6 and transmits the FW to the RAM 10 via the NAND flash memory I/F circuit 12 (step S207). The FW transmitted to the RAM 10 is loaded (recovered) in the RAM 10 in response to the FW read instruction signal from the CPU 8. In addition, and a predetermined process is executed based on the loaded program (step S208). For example, in the non-volatile semiconductor memory device 5 according to the present embodiment, when the memory controller 7 receives the reset signal while the power supply to the interface circuit is interrupted, after the memory controller 7 reads out the internal information stored in the data storing circuit 22 from the data storing circuit 22, the memory controller 7 reads out the FW stored in the NAND Flash Memory 6 from the NAND Flash Memory 6.

Furthermore, in the case when the ROM 9 stores a program in which a part of the FW is developed the CPU 8 may execute a predetermined process based on the program stored in the ROM 9. In the system incorporating the non-volatile semiconductor memory device 5, when the ROM 9 stores a program in which a part of the FW is developed, the time for the CPU 8 reading the FW from the NAND flash memory 6 and the FW being recovered in the RAM 10 can be shortened.

The CPU 8 transmits a FW read instruction signal to the NAND flash memory I/F circuit 12. In parallel, the host 1 transmits a start-up request to the CPU 8 via the PHY 14 and the host I/F circuit 11 (step S209).

Next, when the CPU 8 receives the start-up request, the CPU 8 transmits a signal of an instruction for a start-up to the host I/F circuit 11 and the PHY 14 via the host I/F circuit 11 (step S210). In addition, a start-up sequence is executed until the communication between the host 1 and the non-volatile semiconductor memory device 5 is secured or the communication is recovered (step S211).

When communication between the host 1 and the non-volatile semiconductor memory device 5 is secured and the start-up is completed (S212 of steps), the non-volatile semiconductor memory device 5 can be driven. The non-volatile semiconductor memory device 5 transitions from a powered-on state to an active state that can be driven.

The system incorporating the non-volatile semiconductor memory device 5 according to the present embodiment has the data storing circuit 22. When the system receives a sleep request, the data storing circuit 22 that is not interrupted the second power supply from the second power supply line 31 and is continuing to be received the second power supply. As a result, the system stores the frequency setting value of the reference clock in the data storing circuit 22 without erasing the frequency setting value of the reference clock. In addition, in the system incorporating the non-volatile semiconductor memory device 5 according to the present embodiment, the frequency setting value of the reference clock is read from the data storing circuit 22 on the basis of the start-up request and the reset signal from the reset controller 20, the communication between the host 1 and the non-volatile semiconductor memory device 5 is secured or recovered on the basis of the start-up request, and the control program such as the FW is read from the NAND flash memory 6 to the RAM 10. As a result, the system can reduce the time it takes for the non-volatile semiconductor memory device 5 can be driven after the non-volatile semiconductor memory device 5 receives the power recovery request.

In the system incorporating the non-volatile semiconductor memory device 5 according to the present embodiment, when the non-volatile semiconductor memory device 5 receives a sleep request, for example, the capability of the Host Interface Circuit 11 (Capability) may be stored to the data storing circuit 22.

For example, in the conventional host and non-volatile semiconductor memory device systems, prior to the state of securing communication, the host and the non-volatile semiconductor memory device do not understand the capability of the Host Interface Circuit to each other. Thus, the conventional host and the non-volatile semiconductor memory device, for example, communicated using the largest capability of the Host Interface Circuit in the start-up request. Finally, in the start-up sequence, they exchanged the capability of the Host Interface Circuit with each other to ensure communication. Since the conventional system does not have the data storing circuit 22, when the power supply is interrupted, the capability of the Host Interface Circuit has been erased. Accordingly, in the start-up sequence from the start-up request for restoring communication in the conventional systems, it was required to perform the communication described above every time the power supply is interrupted and the power supply is recovered. Namely, in the conventional system, it took time to secure the communication.

On the other hand, in the system incorporating the non-volatile semiconductor memory device 5 according to the present embodiment, the combination of the host 1 and the non-volatile semiconductor memory device 5 is one, and has a data storing circuit 22. Therefore, in the system incorporating the non-volatile semiconductor memory device 5 according to the present embodiment, the host 1 and the non-volatile semiconductor memory device 5 exchanges the capability of the Host Interface Circuit 11 with each other without using the largest capability of the Host Interface Circuit 11. Therefore, in the system incorporating the non-volatile semiconductor memory device 5 according to the present embodiment, it is possible to secure communication with each other using the capability of the Host Interface Circuit 11 exchanged with each other. Further, in the system incorporating the non-volatile semiconductor memory device 5 according to the present embodiment, even if the power supply is interrupted by receiving the sleep command from the host 1, since the Capability of the Host Interface Circuit 11 exchanged with each other is stored in the data storing circuit 22. Therefore, the Capability of the Host Interface Circuit 11 exchanged with each other is not erased. In the system incorporating the non-volatile semiconductor memory device 5 according to the present embodiment, when the power supply is interrupted by receiving the sleep command and the reset signal is received and the power supply is recovered. The Capability of the host I/F circuit 11 exchanged with each other are read from the data storing circuit 22 without using the maximum Capability of the host I/F circuit 11. In the system incorporating the non-volatile semiconductor memory device 5 according to the present embodiment, the communication between the host 1 and the non-volatile semiconductor memory device 5 can be secured or recovered based on the start-up request. Therefore, in the system incorporating the non-volatile semiconductor memory device 5 according to the present embodiment, as compared with the conventional system, it is possible to accelerate the processing in the step S211 of the non-volatile semiconductor memory device 5.

Here, the Capability of the Host Interface Circuit 11 exchanged with each other includes, for example, the time required for synchronization of the phase difference, the minimum time for transition to the low power state, the minimum time for maintaining the low power state, and the preparation time for returning from the low power state. For example, in the system incorporating the non-volatile semiconductor memory device 5 according to the present embodiment, when having a plurality of differential signal lines, it is required to synchronize the phase difference of the differential signal lines. Therefore, by the time required for synchronization of the phase difference is stored in the data storing circuit 22, it is possible to accelerate the time for the non-volatile semiconductor memory device 5 synchronizes the phase difference of the differential signal line. As a result, it is possible to accelerate the processing in the step S211 of the non-volatile semiconductor memory device 5. Further, in the system incorporating the non-volatile semiconductor memory device 5 according to the present embodiment, when having a low power state as a state of the differential signal, the minimum time for transition to the low power state, the minimum time for maintaining the low power state, and the preparation time for recovering from the low power state may be determined in advance. For example, when the minimum time for transition to the low power state is stored in the data storing circuit 22, the host 1 and the non-volatile semiconductor memory device 5 do not need to replace the maximum time for transition to the low power state. Therefore, it is possible to accelerate the processing in the step S211 of the non-volatile semiconductor memory device 5.

<First Modification of the System Incorporating the Non-Volatile Semiconductor Memory Device>

Figure 5:
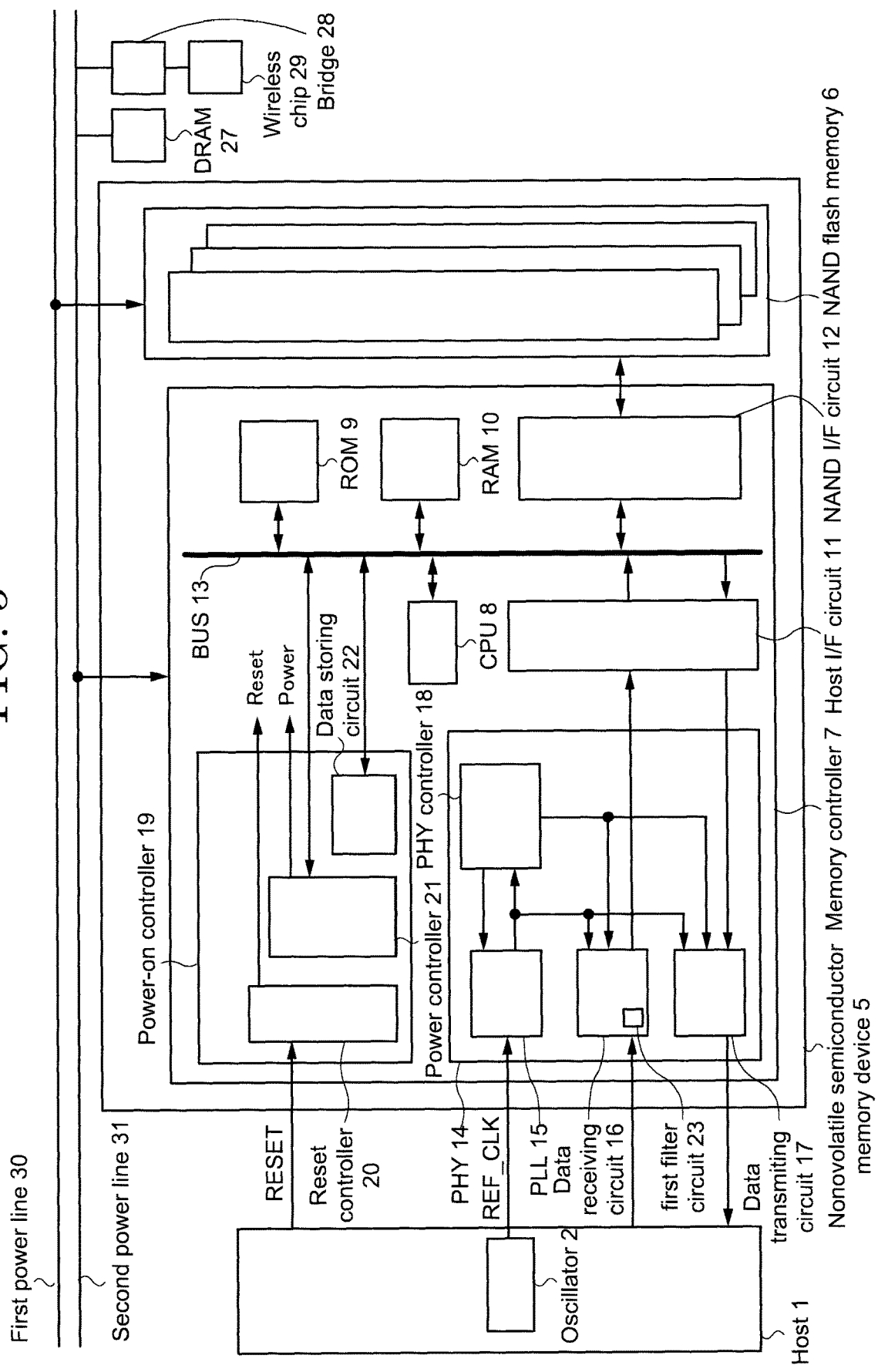
FIG. 5 is a block diagram illustrating a first modification example of a system incorporating a non-volatile semiconductor memory device according to the present embodiment.

A first modification of the system incorporating the non-volatile semiconductor memory device 5 according to the present embodiment will be described with reference to FIG. 5. FIG. 5 is a diagram showing a configuration having a first filter unit 23 in the data receiving circuit 16 illustrated in FIG. 1. Descriptions of the same or similar configurations as in FIGS. 1 to 4 may be omitted.

As shown in FIG. 5, the data receiving circuit 16 includes a first filter circuit 23. The first filter circuit 23 has a function for correcting frequency characteristics of a received high-speed serial data. The function of correcting the frequency characteristics is, for example, a function of shaping the waveform to raise (boost, increase) the amplitude of the high frequency component. The data receiving circuit 16 calibrates the first filter circuit 23 in order to optimize the frequency characteristics of the received data. Calibration may be referred to as training, for example. The filter circuit is also referred to as an equalizer (Equalizer), for example.

The data receiving circuit 16 stores the correction value calibrated by the first filter circuit 23. In this specification or the like, the correction value calibrated by the first filter circuit 23 is also referred to as a first correction value for correcting the frequency characteristics of the high-speed serial data received by the data receiving circuit 16. The PHY 14 may be configured to back up the first correction value to the NAND flash memory 6 through the host I/F circuit 11, the BUS 13, and the NAND flash memory I/F circuit 12 when receiving the signal for reading from the CPU 8 by the sleep request.

In this embodiment, an example in which the correction value is calibrated by the first filter section 23 is a first correction value is shown.

The system incorporating the non-volatile semiconductor memory device 5 according to the present embodiment includes the data storing circuit 22 that receives a sleep request, does not interrupt the second power supply from the second power supply line 31, and continues to receive the power supply. The system transmits the first correction value from the PHY 14 to the data storing circuit 22 without erasing the first correction value, and stores the result in the first correction data storing circuit 22. In addition, the system incorporating the non-volatile semiconductor memory device 5 according to the present embodiment, on the basis of the power recovery request and the reset signal from the reset controller 20, reads the first correction value from the data storing circuit 22. Since the non-volatile semiconductor memory device 5 can be driven based on the first correction value, it is possible to reduce the time required for calibration of the first filter circuit 23. Further, in the system incorporating the non-volatile semiconductor memory device 5 according to the present embodiment, when the first filter circuit 23 is not calibrated or the first filter circuit 23 is an initial setting value which does not require calibration, the first correction value is read from the data storing circuit 22 based on the power recovery request and the reset signal from the reset controller 20. The first correction value becomes the initial setting value of the first filter circuit 23. Therefore, in the system incorporating the non-volatile semiconductor memory device 5 according to the present embodiment, it is possible to omit calibration of the first filter circuit 23.

<Second Modification of the System Incorporating the Non-Volatile Semiconductor Memory Device>

Figure 6:
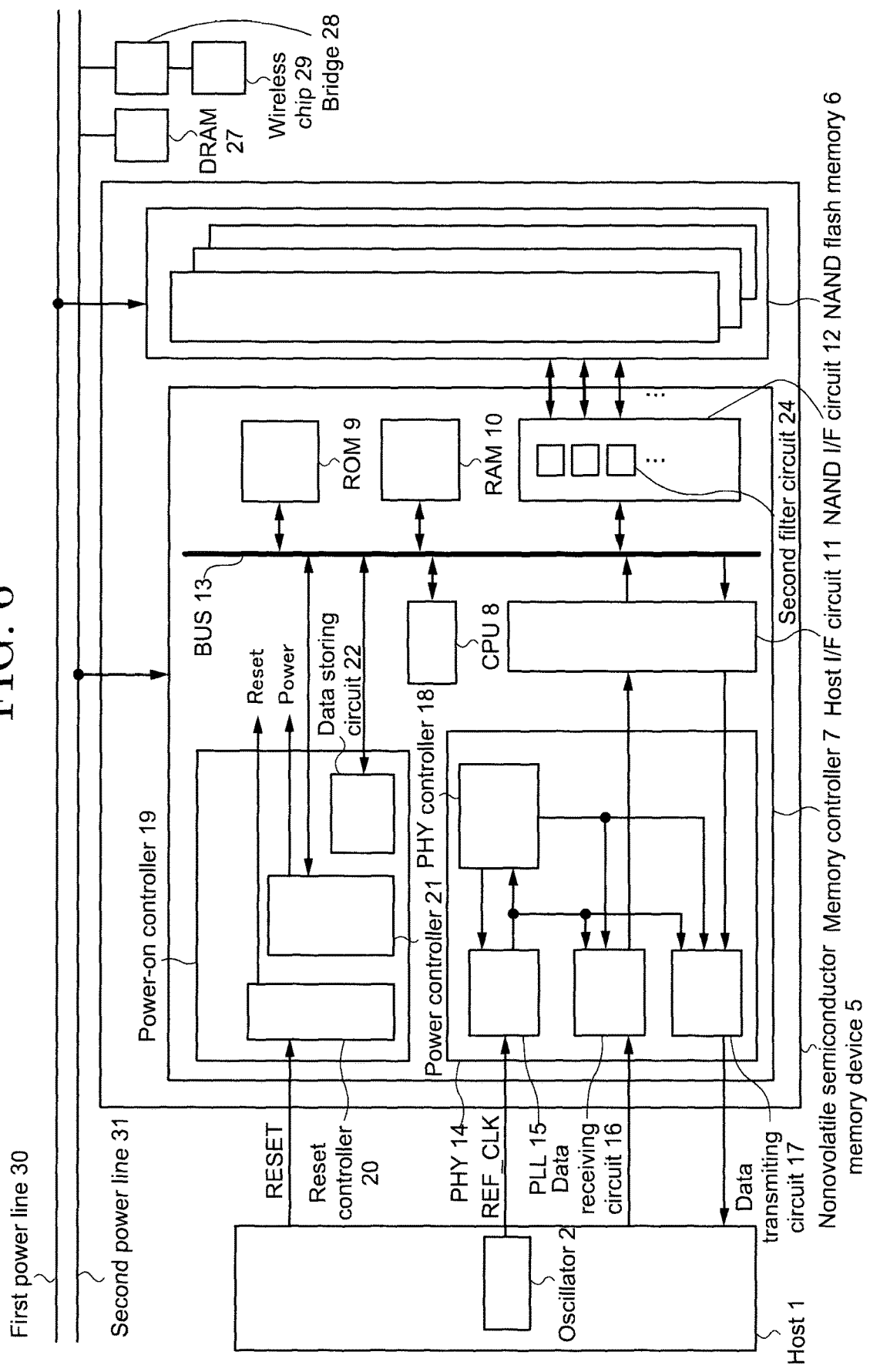
FIG. 6 is a block diagram illustrating a second modification of a system incorporating a non-volatile semiconductor memory device according to the present embodiment.

A second modification of the system incorporating the non-volatile semiconductor memory device 5 according to the present embodiment will be described with reference to FIG. 6. FIG. 6 is a diagram showing a configuration having a second filter circuit 24 in the NAND flash memory I/F circuit 12 shown in FIG. 1. Descriptions of configurations identical to or similar to FIGS. 1-5 may be omitted.

As shown in FIG. 6, the NAND flash memory I/F circuit 12 includes a plurality of second filter circuit 24. For example, a plurality of two-way communication are secured between the NAND flash memory I/F circuit 12 and the NAND flash memory 6. One second filter circuit 24 is provided for each of a plurality of two-way communication paths. The second filter circuit 24 includes, for example, DLLs (Delay Locked Loop). By having the DLL, the second filter circuit 24 detects the delay (gap) of the round-trip signal in the two-way communication of the NAND flash memory I/F circuit 12 and the NAND flash memory 6, and adjusts the delay of the round-trip signal in the two-way communication between the NAND flash memory I/F circuit 12 and the NAND flash memory 6. The NAND flash memory I/F circuit 12 can be calibrated by adjusting the delay of round trip signals in the two-way communication between the NAND flash memory I/F circuit 12 and the NAND flash memory 6. Each of the plurality of second filter circuit 24 is independently controlled. Adjusting the round-trip signal delay in the two-way communication, for example, as described herein, may include individually adjusting each of the output data, the input data, and the data receiving strobe in the DLL.

The second filter circuit 24 stores a correction value which is adjusted for the delay of the signal. In this specification or the like, the correction value (delay value) adjusted for the round trip delay in two-way communication between the NAND flash memory I/F circuit 12 and the NAND flash memory 6 is also referred to as the second correction value. Incidentally, when the NAND flash memory I/F circuit 12 receives the signal for reading from the CPU 8 by the sleep requests, the second correction values included in the second filter circuit 24 may be configured to be backed up to the NAND flash memory 6.

In the present embodiment, it is shown that the internal information is the correction value (second correction value) adjusted for the delay of the round-trip signals in the two-way communication between the NAND flash memory I/F circuit 12 and the NAND flash memory 6.

The system incorporating the non-volatile semiconductor memory device 5 according to the present embodiment receives the sleep request and has the data storing circuit 22 which does not interrupt the second power supply from the second power supply and continues to receive the power supply. As a result, when the system incorporating the non-volatile semiconductor memory device 5 according to the present embodiment receives the sleep request, the system transmits the second correction value from the NAND flash memory I/F circuit 12 to the data storing circuit 22. The system incorporating the non-volatile semiconductor memory device 5 according to the present embodiment can store the second correction value in the data storing circuit 22 without erasing the second correction value. In addition, when the system incorporating the non-volatile semiconductor memory device 5 reads the second correction value from the data storing circuit 22 based on the power recovery request and a reset signal from the reset controller 20, it is able to communicate between the NAND flash memory I/F circuit 12 and the NAND flash memory 6 based on the second correction value stored in the data storing circuit 22 in advance. As a result, since it is not necessary to execute the calibration of the delay to the NAND flash memory I/F circuit 12 and the NAND flash memory 6 in accordance with the power recovery, it is possible to omit the time of the calibration of the delay to the NAND flash memory I/F circuit 12 and the NAND flash memory 6.

<Third Modification of the System Incorporating the Non-Volatile Semiconductor Memory Device>

Figure 7:
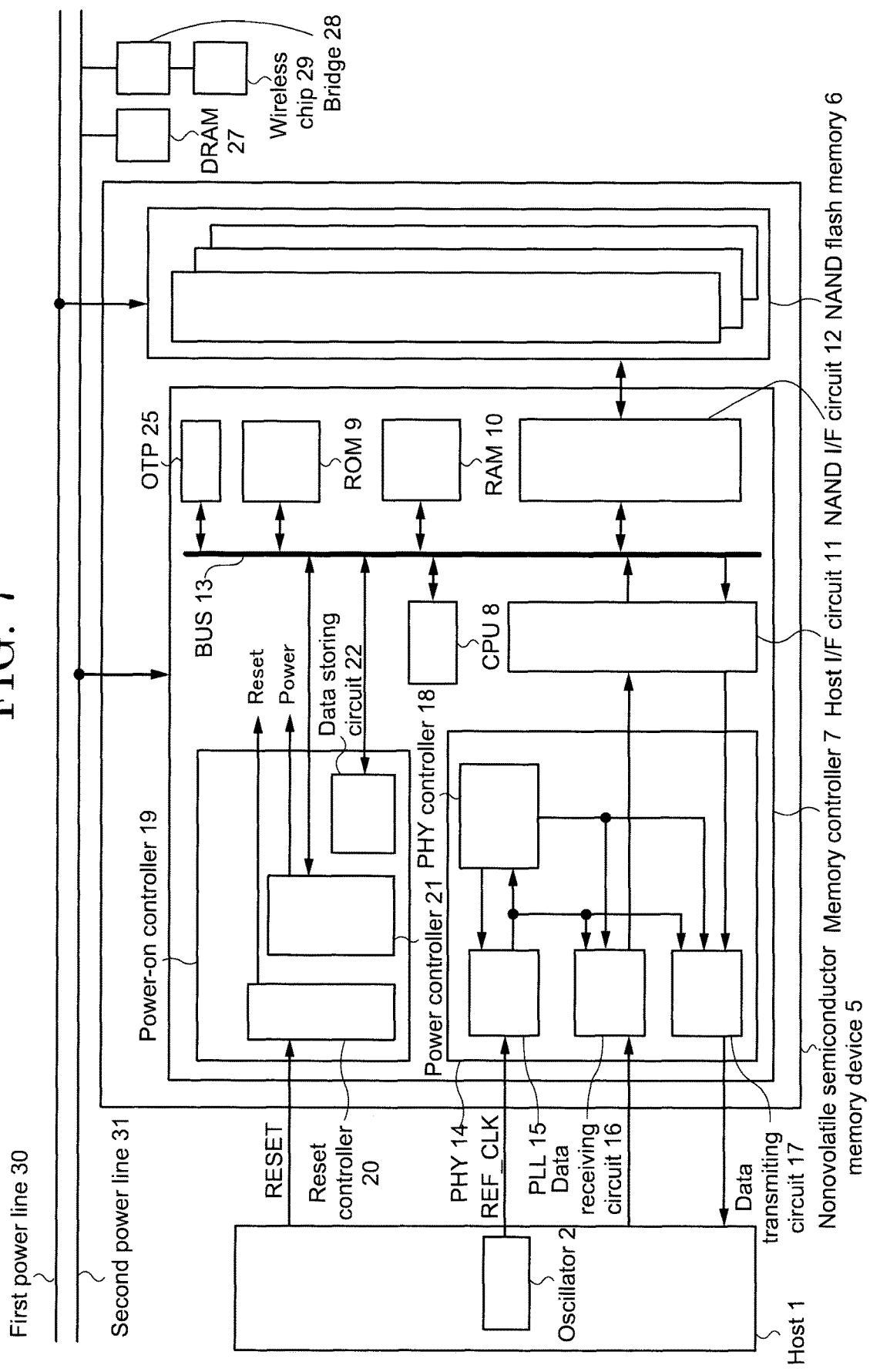
FIG. 7 is a block diagram illustrating a third modification of a system incorporating a non-volatile semiconductor memory device according to the present embodiment.

The third modification of the system incorporating the non-volatile semiconductor memory device 5 according to the present embodiment will be described with reference to FIG. 7. FIG. 7 is a diagram illustrating a configuration in which OTP (One Time Programmable Memory) 25 is added to the configuration shown in FIG. 1. Descriptions of the same or similar configurations as in FIGS. 1 to 6 may be omitted.

As shown in FIG. 7, the OTP 25 is connected to the BUS 13, and is interconnected via a BUS 13 to a CPU 8, the ROM 9, the RAM 10, the host I/F circuit 11 and the NAND flash memory I/F circuit 12. The OTP 25 is a non-volatile memory with a number of limited rewrites. The OTP 25, for example, can be rewritten ten times.

In this embodiment, for example, the first filter circuit 23 shown in FIG. 6 may be implemented. In the present embodiment, when each block receives signals for reading from the CPU 8 by the sleep requests, the uncalibrated values are transmitted from each block to the OTP 25 and stored, and the calibrated values are transmitted from each block to the data storing circuit 22 and stored and stored. Uncalibrated values are less likely to be overwritten frequently, and the uncalibrated values are never overwritten. Therefore, uncalibrated values, etc. are stored in the OTP 25. Since the calibrated value is likely to be replaced frequently, the calibrated value is stored in the data storing circuit 22. For example, the default setting value (the initial setting value) such as the frequency setting value of the reference clock is stored in the OTP 25, and the value dynamically rewritten such as the calibrated first correction value is stored in the data storing circuit 22.

By having a data storing circuit 22 and a OTP 25, the system incorporating the non-volatile semiconductor memory device 5 according to the present embodiment can store each internal information in a memory suitable for each internal information according to the rewriting frequency of the internal information on the basis of the power recovery request from the reset controller 20 and the reset signal.

While several embodiments of the present disclosure have been described, these embodiments are presented as examples and are not intended to limit the scope of the invention. These new embodiments may be implemented in a variety of other embodiments and may be implemented in any combination with no deviations from the abstract of the invention, and various omissions, replacements, and modifications may be made. These embodiments and variations are included in the scope and abstract of the invention, as well as in the claimed invention and its equivalents.

What is claimed is:

1. A non-volatile semiconductor memory device comprising:
   a non-volatile semiconductor memory;
   a controller controlling the non-volatile semiconductor memory, including a reset terminal capable of receiving a reset signal from a host, an interface circuit capable of receiving a sleep command, and a data storing circuit;
   the controller resets the data storing circuit, upon reception of the reset signal in a state of being supplied with power to the interface circuit;
   the controller stores a data necessary for a communication with the host or the non-volatile semiconductor memory device and interrupting the power supply to the interface circuit, upon a reception of the sleep command in a state of being supplied with power to the interface circuit; and
   the controller reads the data from the data storing circuit, upon reception of the reset signal in a state of being supplied with power interrupted to the interface circuit.

2. The non-volatile semiconductor memory device according to claim 1, further comprising:
   a first power supply line supplying power to the non-volatile semiconductor memory;
   a second power supply line supplying power to the controller; and
   the controller upon a reception of the sleep command, responds to the host that the non-volatile semiconductor memory is capable of interrupting the power supply to the first power supply line while keep maintaining the power supply to the second power supply line.

3. The non-volatile semiconductor memory device according to the claim 1, wherein:
   the controller reads the data from the data storing circuit and reads firmware from the non-volatile semiconductor memory, upon a reception of the reset signal in the state of power being interrupted to the interface circuit.

4. The non-volatile semiconductor memory device according to claim 1, wherein;
   the data includes a setting value related to a frequency of a reference clock for driving the non-volatile semiconductor memory.

5. The non-volatile semiconductor memory device according to claim 1, wherein;
   the data includes a correction value for correcting a frequency characteristic of a received data.

6. The non-volatile semiconductor memory device according to claim 1, wherein;
   the controller includes a non-volatile semiconductor memory interface circuit;
   the data includes a correction value for correcting a delay value of a communication between the non-volatile semiconductor memory and the non-volatile semiconductor memory interface circuit.

7. The non-volatile semiconductor memory device according to claim 1, wherein;
   the data includes a capability of the interface circuit, and the capability is exchanged between the host and the interface circuit.

8. A method for driving a non-volatile semiconductor memory device,
   the non-volatile semiconductor memory device comprising:
   a non-volatile semiconductor memory;
   a controller controlling the non-volatile semiconductor memory, including a reset terminal capable of receiving a reset signal from a host, an interface circuit capable of receiving a sleep command, and a data storing circuit;
   the method for driving the non-volatile semiconductor memory device comprising:
   the controller resetting the data storing circuit, upon a reception of the reset signal from the host in a state of being supplied with power to the interface circuit;
   the controller storing a data necessary for a communication with the host or the non-volatile semiconductor memory device into the data storing circuit and transiting into a state of being interrupted of power to the interface circuit, upon a reception of the sleep command from the host in a state of being supplied with power to the interface circuit; and
   the controller transiting into a state of reading the data from the data storing circuit, upon a reception of the reset signal from the host in a state of being interrupted of power to the interface circuit.

9. The method for driving the non-volatile semiconductor memory device according to claim 8, wherein
   the non-volatile semiconductor memory further comprises:
   a first power supply line supplying power to the non-volatile semiconductor memory;
   a second power supply line supplying s power to the controller; and
   the controller responding to the host that the non-volatile semiconductor memory is capable of interrupting the power supply to the first power supply line while keep maintaining the power supply to the second power supply line, upon reception of the sleep command from the host to the controller.

10. The method for driving the non-volatile semiconductor memory device according to claim 8, wherein;
    the controller reads the data from the data storing circuit and reads firmware from the non-volatile semiconductor memory, after reading the data from the data storing circuit upon a reception of the reset signal in the state of power being interrupted to the interface circuit.

11. The method for driving the non-volatile semiconductor memory device according to claim 8, wherein;
    the data includes a setting value related to a frequency of a reference clock for driving the non-volatile semiconductor memory device.

12. The method for driving the non-volatile semiconductor memory device according to claim 8, wherein;

the data includes a first correction value for correcting a frequency characteristic of a received data.

13. The method for driving the non-volatile semiconductor memory device according to claim 8, wherein;
   the controller includes a non-volatile semiconductor memory interface circuit communicating with the non-volatile semiconductor memory device; and
   the data includes correction value for correcting a delay value of communication between the non-volatile semiconductor memory device and the non-volatile semiconductor memory interface circuit.

14. The method for driving the non-volatile semiconductor memory device according to claim 8, wherein;
   the data includes a capability of the interface circuit, and
   the capability is exchanged between the host and the interface circuit.

* * * * *